US006265247B1

(12) United States Patent
Nakanishi et al.

(10) Patent No.: US 6,265,247 B1
(45) Date of Patent: Jul. 24, 2001

(54) THIN-FILM TRANSISTOR AND MANUFACTURING METHOD FOR IMPROVED CONTACT HOLE

(75) Inventors: Shiro Nakanishi, Ohgaki; Nobuhiko Oda, Hashima, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/334,444

(22) Filed: Jun. 15, 1999

Related U.S. Application Data (62) Division of application No. 09/162,209, filed on Sep. 28, 1998, now Pat. No. 5,962,916.

(30) Foreign Application Priority Data

Sep. 30, 1997 (JP) .................................................. 9-266706

(51) Int. Cl.[7] ............................. H01L 21/00; H01L 21/84
(52) U.S. Cl. ........................ 438/149; 438/638; 438/640; 438/978
(58) Field of Search .................................. 438/149, 158, 438/157, 189, 161–164, 199, 234, 372, 701, 713, 978, 638, 640, 673, 719, 723, 724, 738, 739, FOR 127, FOR 105; 257/52–69, 635, 637, 640, 350

(56) References Cited

U.S. PATENT DOCUMENTS

| 5,130,772 | 7/1992 | Choi ....................................... 257/347 |
| 5,296,729 | * 3/1994 | Yamanaka et al. ................... 257/377 |
| 5,440,168 | * 8/1995 | Nishimura et al. ................... 257/640 |
| 5,468,986 | 11/1995 | Yamanashi ........................... 257/389 |
| 5,616,933 | 4/1997 | Li . |
| 5,917,225 | * 6/1999 | Yamazaki et al. .................... 257/411 |

FOREIGN PATENT DOCUMENTS

| 358137215 A | * 8/1983 | (JP) . |
| 401053559 A | * 3/1989 | (JP) . |

OTHER PUBLICATIONS

Wolf, Silicon Processing for the VLSI Era, vol. 1, p. 522, 1986.*

* cited by examiner

Primary Examiner—Olik Chaudhuri
Assistant Examiner—Hoai Pham
(74) Attorney, Agent, or Firm—Cantor Colburn LLP (57) ABSTRACT

On a transparent substrate, on which is positioned a gate electrode, a silicon nitride film and a silicon oxide film are formed as gate insulating films, and furthermore a polycrystalline silicon film is formed as a semiconductor film to become an active region. A stopper is positioned on the polycrystalline silicon film to correspond to a gate electrode, and a silicon oxide film, a silicon nitride film, and a silicon oxide film are formed as interlayer insulating film so as to cover the stopper. Contact holes are formed in the layer insulating film to correspond to a source region and a drain region, and a source electrode and a drain electrode are positioned through these contact holes. Since the silicon oxide film having a fast etching rate is formed on the silicon nitride film having a slow etching rate, the etching from the silicon oxide film above the silicon nitride film dominates when forming the contact holes in the layer insulating film so that the etched shape of the silicon nitride film assumes a tapered shape widening toward the top.

7 Claims, 6 Drawing Sheets

THIN-FILM TRANSISTOR AND MANUFACTURING METHOD FOR IMPROVED CONTACT HOLE

CROSS-REFERENCE TO RELATED APPLICATION

This is a divisional application of U.S. Ser. No. 09/162,209 filed on Sep. 28, 1998, now U.S. Pat. No. 5,962,916 which is incorporated herein by reference in its entirety.

BACKGROUND OF THE INVENTION

1. Field of the Invention

The present invention relates to a thin-film transistor suitable as image display switching elements in active matrix type display panels and to a thin-film transistor manufacturing method.

2. Description of the Related Art

Figure 1:
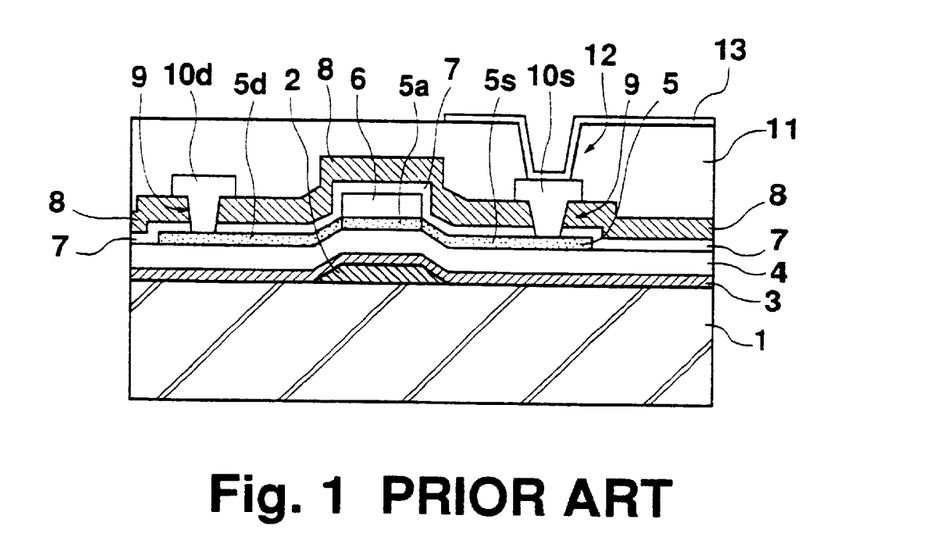
FIG. 1 is a cross-sectional view showing a structure of a conventional thin-film transistor.

FIG. 1 is a cross-sectional view showing a structure of a bottom-gate type of thin-film transistor.

On a surface of an insulating transparent substrate 1 is positioned a gate electrode 2 of a metal having a high melting point, such as tungsten or chromium. The gate electrode 2 has both ends in a tapered shape widening toward the transparent substrate 1. On the transparent substrate 1, on which the gate electrode 2 is positioned, a silicon nitride film 3 and a silicon oxide film 4 are formed. The silicon nitride film 3 prevents impurities contained in the transparent substrate 1 from penetrating an active region (to be mentioned later), and the silicon oxide film 4 acts as a gate insulating film. On the silicon oxide film 4 is formed a polycrystalline silicon film 5 so as to transverse over the gate electrode 2. The polycrystalline silicon film 5 becomes the active region of the thin-film transistor.

On the polycrystalline silicon film 5 is positioned a stopper 6 of an insulating material, such as silicon oxide. A portion of the polycrystalline silicon film 5 covered by the stopper 6 becomes a channel region 5a, and other portions of the polycrystalline silicon film 5 become a source region 5s and a drain region 5d. On the polycrystalline silicon film 5, on which is formed the stopper 6, a silicon oxide film 7 and a silicon nitride film 8 are formed. The silicon oxide film 7 and silicon nitride film 8 serve as layer insulating films to protect the polycrystalline silicon film 5, which includes the source region 5s and drain region 5d.

Contact holes 9 are formed at predetermined locations in the silicon oxide film 7 and silicon nitride film 8 on the source region 5s and drain region 5d. A source electrode 10s and a drain electrode 10d, which connect to the source region 5s and drain region 5d, are positioned at the contact holes 9. On the silicon nitride film 8, on which the source electrode 10s and drain electrode 10d are positioned, an acrylic resin layer 11, which is transparent to visible light, is formed. The acrylic resin layer 11 flattens the surface by filling in the unevenness caused by the gate electrode 2 and stopper 6 and so on.

A contact hole 12 is formed in the acrylic resin layer 11 on the source electrode 10s. A transparent electrode 13 of indium tin oxide (ITO) that connects to the source electrode 10s through the contact hole 12 is then positioned so as to extend on the acrylic resin layer 11. The transparent electrode 13 forms a pixel electrode in a liquid crystal display panel.

In the above-mentioned thin-film transistor, a plurality of which are arranged in a matrix on the transparent substrate 1 together with pixel electrodes, image data supplied to the drain electrode 10d is impressed onto the respective pixel electrode in response to the scanning control signal that is impressed on the gate electrode 2.

It is preferable for the polycrystalline silicon film 5 to be formed with a sufficiently large crystal grain diameter so that it functions as the active region of the thin-film transistor. A known method for forming a large crystal grain diameter of the polycrystalline silicon film 5 is laser annealing using an excimer laser. In laser annealing, amorphous silicon is formed onto the silicon oxide film 4, which becomes a gate insulating film, and after the hydrogen contained in the amorphous silicon is removed through a low temperature heat treatment, the silicon is irradiated with the excimer laser and is initially melted so that the silicon crystallizes. Since portions on the transparent substrate 1 reaching high temperatures are localized due to the use of this sort of laser annealing method, a glass substrate having a low melting point can be used for the transparent substrate 1.

Due to the large amount of crystal defects, the polycrystalline silicon film 5 that was crystallized by laser annealing is not suitable as the active region of the transistor as the electrons moving within the film are easily trapped. Forming an insulating film containing a large amount of hydrogen ions on the polycrystalline silicon film 5 that was initially formed and heat treating together with the insulating film fills the crystal defects with the hydrogen ions.

Silicon nitride films are known as insulating films containing large amounts of hydrogen ions. The hydrogen ion concentration of silicon nitride films formed by plasma CVD is ordinarily about $10^{22}/cm^3$, which is an order of 2 higher when compared to the hydrogen ion concentration ($10^{20}/cm^3$) of silicon oxide film formed by the same plasma CVD. Since transistor characteristics are degraded when this sort of silicon nitride film is formed directly on the active region, a silicon oxide film is formed between the active region and the silicon nitride film as shown in FIG. 1.

Figure 2:
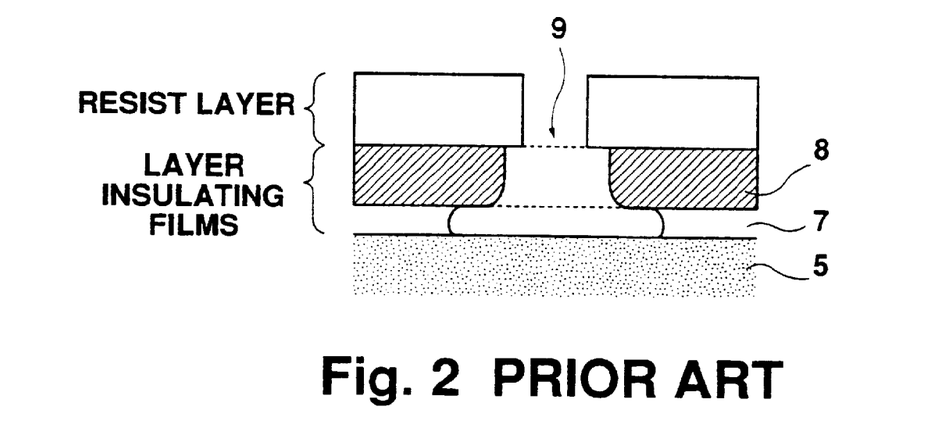
FIG. 2 is a cross-sectional view showing a shape of a contact hole of the conventional thin-film transistor.

However, at the layer insulating films in which the silicon nitride film 8 overlaps the silicon oxide film 7, when forming the contact holes 9 by etching using a hydrofluoric acid-based etchant, a problem occurs where the contact holes 9 become wider at the bottom due to differences in the etching rates. Namely, with respect to the hydrofluoric acid-based etchant, the etching rate of the silicon oxide film 7 is faster than that of the silicon nitride film 8, resulting in the silicon oxide film 7 part being wider than the silicon nitride film 8 part as shown in FIG. 2. Therefore, the source electrode 10s or drain electrode 10d formed at the contact holes 9 is susceptible to disconnection, and may result in contact failure.

SUMMARY OF THE INVENTION

It is therefore an object of the present invention to improve the shape of the contact holes to be formed in the layer insulating films.

The thin-film transistor of the present invention comprises a gate electrode positioned on a substrate, a gate insulating film formed so as to cover the gate electrode on the substrate, a semiconductor film formed on the gate insulating film, interlayer insulating film formed on the semiconductor film, and an electrode connected to the semiconductor film and passing through the interlayer insulating film. The layer insulating films include a silicon nitride film, and a first and second silicon oxide films sandwiching this silicon nitride film.

Furthermore, the thin-film transistor of the present invention comprises the semiconductor film formed on the substrate, the gate insulating film formed on the semiconductor film, the gate electrode positioned on the gate insulating film so as to cross the semiconductor film, interlayer insulating film formed so as to cover the gate electrode on the gate insulating film, and an electrode connected to the semiconductor film and passing through the layer insulating film. The interlayer insulating film includes a silicon nitride film, and a first and second silicon oxide films sandwiching this silicon nitride film.

Furthermore, in the thin-film transistor of the present invention, the gate electrode and the semiconductor film are formed so as to sandwich the gate insulating film on the substrate, and interlayer insulating film, in which contact holes are formed, are formed on the semiconductor film. The interlayer insulating film comprises a lowermost insulating layer in contact with the semiconductor film and for matching with the semiconductor film, an intermediate (a middle) insulating layer formed on the lowermost insulating layer as a hydrogen ion supply source to the semiconductor film, and an uppermost insulating layer formed on the intermediate insulating layer and having an etching rate faster than that of the intermediate insulating layer with respect to etching during contact hole formation.

The manufacturing method of the thin-film transistor of the present invention comprises a first process for forming the gate electrode on one principal plane of the substrate, a second process for forming the gate insulating film on the substrate so as to cover the gate electrode, and forming the semiconductor film on the gate insulating film, a third process for forming the layer insulating films on the semiconductor film, a fourth process for forming the contact holes penetrating the interlayer insulating film and reaching the semiconductor film, and a fifth process for forming the electrodes to connect to the semiconductor film through the contact holes. The third process forms in sequence the first silicon oxide film, the silicon nitride film, and the second silicon oxide film, and the fifth process successively etches in an isotropic manner the interlayer insulating film from the surface until the semiconductor film.

Furthermore, the manufacturing method of the thin-film transistor of the present invention comprises a first process for forming the semiconductor film on one principal plane of the substrate, a second process for forming the gate insulating film on the semiconductor film and forming the gate electrode on the gate insulating film, a third process for forming the interlayer insulating film on the gate insulating film so as to cover the gate electrode, a fourth process for forming contact holes through the interlayer insulating film and reaching the semiconductor film, and a fifth process for forming the electrodes to connect to the semiconductor film through the contact holes. The third process forms in sequence the first silicon oxide film, the silicon nitride film, and the second silicon oxide film on the semiconductor film, and the fourth process successively etches the interlayer insulating film from the surface until the semiconductor film.

According to the present invention, when etching is performed to form the contact holes, since the silicon oxide film having an etching rate faster than that of the silicon nitride film is the uppermost layer, etching from the upper layers dominates. Thus, the shape of the silicon nitride film itself assumes a tapered shape and broadens toward the upper layers so that a contact hole is formed having satisfactory step coverage for the electrode shape.

According to the present invention, it is possible to improve the shape of the contact holes passing through the interlayer insulating film and reaching the semiconductor film. This makes it possible to prevent the occurrence of contact failure between the electrodes and semiconductor film and at the same time prevent degradation of the operating characteristics of the transistor, so as a result, improvements in manufacturing yield can be expected.

Also, after being formed, the interlayer insulating film is heated in a nitrogen atmosphere so that the hydrogen contained in the silicon nitride film, which is an intermediate layer in the interlayer insulating film, are introduced into the polycrystalline silicon film. As a result, the crystal defects within the polycrystalline silicon film are filled by the hydrogen ion.

DETAILED DESCRIPTION OF THE PREFERRED EMBODIMENTS

Figure 3:
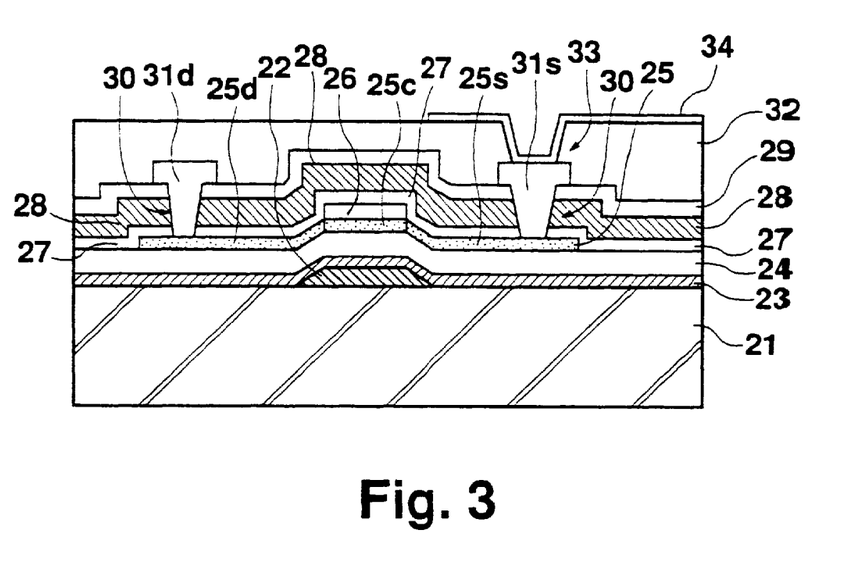
FIG. 3 is a cross-sectional view showing a first embodiment of the thin-film transistor of the present invention.

FIG. 3 is a cross-sectional view showing the first embodiment of the thin-film transistor of the present invention. In this figure, a transparent substrate 21, a gate electrode 22, a silicon nitride film 23, a silicon oxide film 24, and a polycrystalline silicon film 25 are respectively identical to the transparent substrate 1, gate electrode 2, silicon nitride film 3, silicon oxide film 4, and polycrystalline silicon film 5 shown in FIG. 1.

The gate electrode 22 is positioned on a surface of the transparent substrate 21, and the silicon nitride film 23 and silicon oxide film 24 are formed as gate insulating films to cover the gate electrode 22. On the silicon oxide film 24 is further formed the polycrystalline silicon film 25 as a semiconductor film to act as the active region.

On the polycrystalline silicon film 25 is positioned a stopper 26 of silicon oxide. The region covered by the stopper 26 in the polycrystalline silicon film 25 becomes a channel region 25c, and the other regions in the polycrystalline silicon film 25 become a source region 25s and a drain region 25d. On the polycrystalline silicon film 25, on which stopper 26 is formed, a silicon oxide film 27 is formed having insignificant adverse effects even while in contact with the polycrystalline silicon film 25. On the silicon oxide film 27 is formed a silicon nitride film 28, which contains more hydrogen ions than the silicon oxide film 27 and becomes a main supply source of hydrogen ions. Furthermore, on the silicon nitride film 28 is formed a silicon oxide film 29. The silicon oxide film 27, silicon nitride film 28, and silicon oxide film 29 form interlayer insulating film to protect the polycrystalline silicon film 25.

The interlayer insulating film comprising three layers of silicon oxide film 27, silicon nitride film 28, and silicon oxide film 29 is provided with contact holes 30 that reach the polycrystalline silicon film 25. At these contact holes 30 are positioned a source electrode 31s and a drain electrode 31d that respectively connect to the source region 25s and drain region 25d. On the interlayer insulating film is formed an acrylic resin layer 32 that flattens the surface and covers the source electrode 31s and drain electrode 31d. Furthermore, a contact hole 33 reaching the source electrode 31s is provided in the acrylic resin layer 32, where a transparent electrode 34 that connects to the source electrode 31s is positioned so as to extend on the acrylic resin layer 32. The source electrode 31s, drain electrode 31d, and transparent electrode 34 are respectively identical to the source electrode 10s, drain electrode 10d, and transparent electrode 13 of the thin-film transistor shown in FIG. 1.

Figure 4:
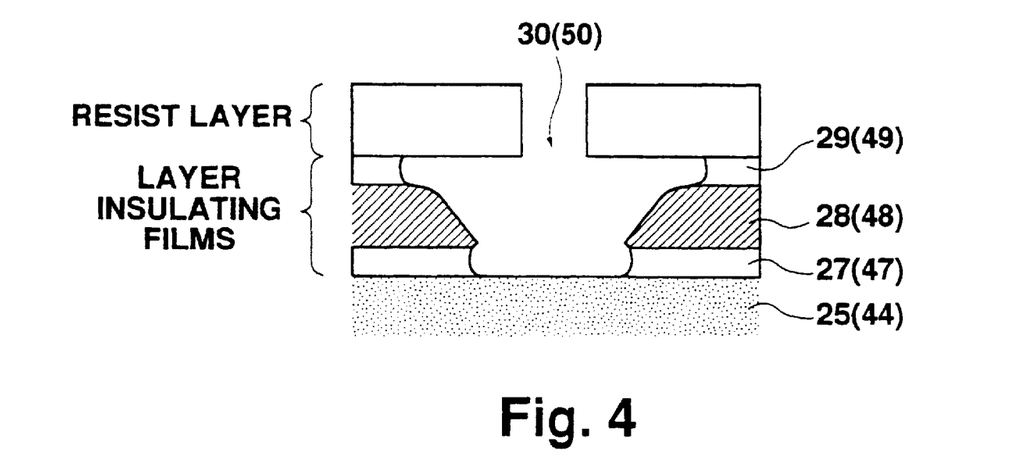
FIG. 4 is a cross-sectional view showing a shape of the contact hole of the thin-film transistor of the present invention.

In the above-mentioned thin-film transistor, the layer insulating films are formed from silicon nitride film 28, and silicon oxide films 27, 29, which have a faster etching rate with respect to a hydrofluoric acid-based etchant than that of the silicon nitride film 28. Thus, when the contact holes 30 are formed by an etching process using the hydrofluoric acid-based etchant, the etching of the silicon oxide film 29, which is the uppermost layer and has the faster etching rate, dominates so that the silicon nitride film 28 is etched in a tapered shape, which is wide at the top. Thus, as shown in FIG. 4, the width of the contact holes 30 differs slightly at the silicon oxide film 27 portion and at the silicon nitride film 28 portion. Therefore, contact failure can be prevented of the source electrode 31s and drain electrode 31d that are formed through the contact holes 30.

Figure 5:
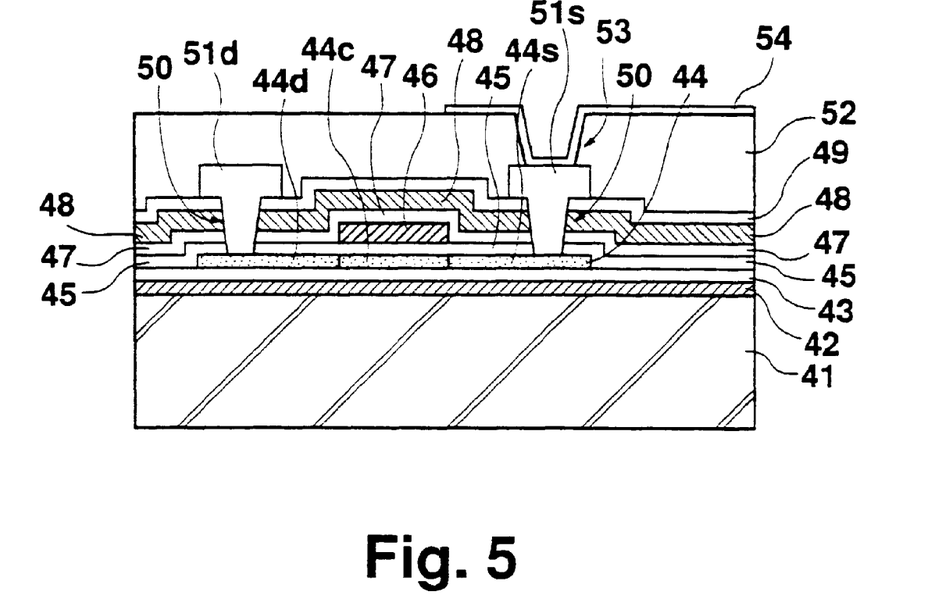
FIG. 5 is a cross-sectional view showing a second embodiment of the thin-film transistor of the present invention.

FIG. 5 is a cross-sectional view showing the second embodiment of the thin-film transistor of the present invention. This figure shows a top-gate type.

On a surface of an insulating transparent substrate 41 are formed a silicon nitride film 42 and a silicon oxide film 43. The silicon nitride film 42 prevents precipitation of impurity ions, such as sodium, contained in the transparent substrate 41, and the silicon oxide film 43 facilitates the disposition of a polycrystalline silicon film 44 that serves as the active region. At a predetermined region on the silicon oxide film 43 is formed the polycrystalline silicon film 44 as the semiconductor film that serves as the active region of the thin-film transistor.

On the silicon oxide film 43 formed with the polycrystalline silicon film 44 is formed a silicon oxide film 45 that serves as the gate insulating film. On the silicon oxide film 45 is positioned a gate electrode 46 of a metal (refractory metal) having a high melting point, such as tungsten or chromium. The gate electrode 46 is positioned so as to cross the direction in which the polycrystalline silicon film 44 extends. The region covered by the gate electrode 46 in the polycrystalline silicon film 44 becomes a channel region 44c, and the other regions of the polycrystalline silicon film 44 become a source region 44s and a drain region 44d.

On the silicon oxide film 45, on which the gate electrode 46 is positioned, is formed a silicon oxide film 47. On the silicon oxide film 47 is formed a silicon nitride film 48, and further on the silicon nitride film 48 is formed a silicon oxide film 49. The silicon oxide film 47, silicon nitride film 48, and silicon oxide film 49 form interlayer insulating film to protect the polycrystalline silicon film 44.

The interlayer insulating film is provided with contact holes 50 that reach the polycrystalline silicon film 44 where are positioned at a source electrode 51s and a drain electrode 51d that respectively connect to the source region 44s and drain region 44d. On the interlayer insulating film is formed an acrylic resin layer 52 that flattens the surface and covers the source electrode 51s and drain electrode 51d. Furthermore, a contact hole 53 reaching the source electrode 51s is provided in the acrylic resin layer 52, where a transparent electrode 54 that connects to the source electrode 51s is positioned so as to widen upward on the acrylic resin layer 52. The source electrode 51s, drain electrode 51d, and transparent electrode 54 are identical to those of the bottom-gate type.

In the above-mentioned thin-film transistor also, when the contact holes 50 are formed by etching using a hydrofluoric acid-based etchant, the width of the contact holes 50, as in the case of the top-gate type (FIG. 4), differs slightly at the silicon oxide film 47 portion and at the silicon nitride film 48 portion.

FIGS. 6A to 6F are cross-sectional views of individual processes 6A to 6F illustrating the manufacturing method of the thin-film transistor related to in the first embodiment. These views show the same part as FIG. 3.

Figure 6A:
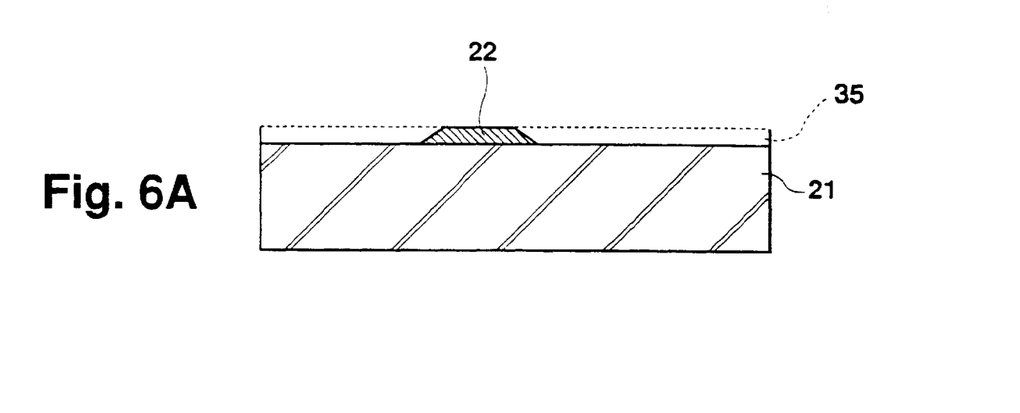
FIG. 6A, 6B, 6C, 6D, 6E, and 6F are cross-sectional views showing various processes of the manufacturing method related to in the first embodiment.

(a) Process 6A

On the insulating transparent substrate 21 is formed through sputtering a metal having a high melting point, such as chromium or molybdenum, at a film thickness of 1000 angstroms to form a high melting point metal film 35. The high melting point metal film 35 is patterned in a predetermined shape to form gate electrode 22. This patterning process forms both ends of the gate electrode 22 through tapered etching into a tapered shape so as to widen toward the transparent substrate 21.

Figure 6B:
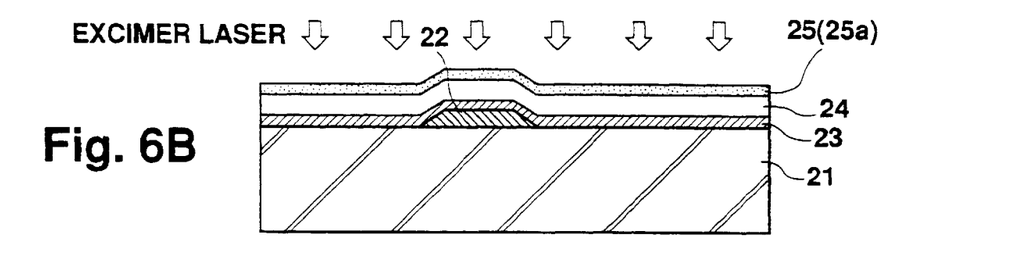

(b) Process 6B

On the transparent substrate 21 are formed, using plasma CVD, silicon nitride at a film thickness of at least 500 angstroms, and in succession silicon oxide at a film thickness of at least 1300 angstroms. This forms the silicon nitride film 23 and the silicon oxide film 24, which becomes the gate insulating films, to prevent precipitation of impurity ions from the transparent substrate 21. On the silicon oxide film 23 is formed, using the same plasma CVD, silicon at a film thickness of 400 angstroms to form an amorphous silicon film 25a. The hydrogen is then removed from the film by a heat treatment at around 430° C. for at least one hour, and after the hydrogen concentration drops to 1 atomic % or less, an excimer laser is aimed at the silicon film 25a to heat the amorphous silicon until it melts. As a result, the silicon solidifies into the polycrystalline silicon film 25.

Figure 6C:
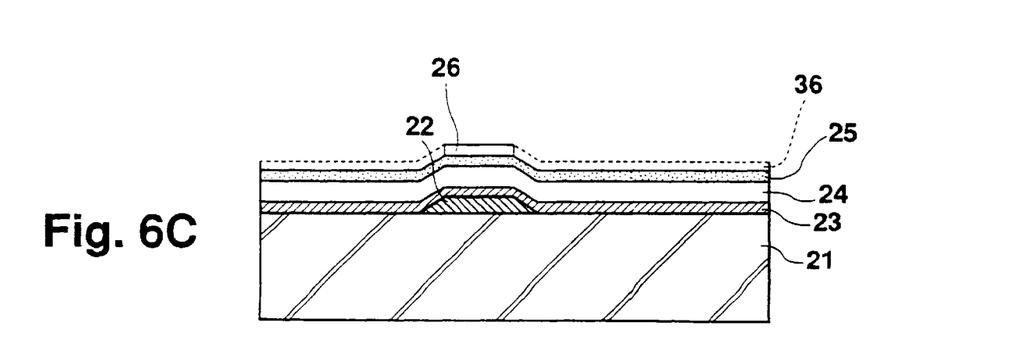

(c) Process 6C

Silicon oxide is formed at a film thickness of 1000 angstroms on the polycrystalline silicon film 25 to form the silicon oxide film 36. The silicon oxide film 35 is then patterned corresponding to the shape of the gate electrode 22 to form the stopper 26 overlapping the gate electrode 22. In the formation of the stopper 26, the resist layer is formed to cover the silicon oxide film 36, and the resist layer is exposed from the transparent substrate side using the gate electrode 22 as a mask, thus eliminating mask deviation.

Figure 6D:
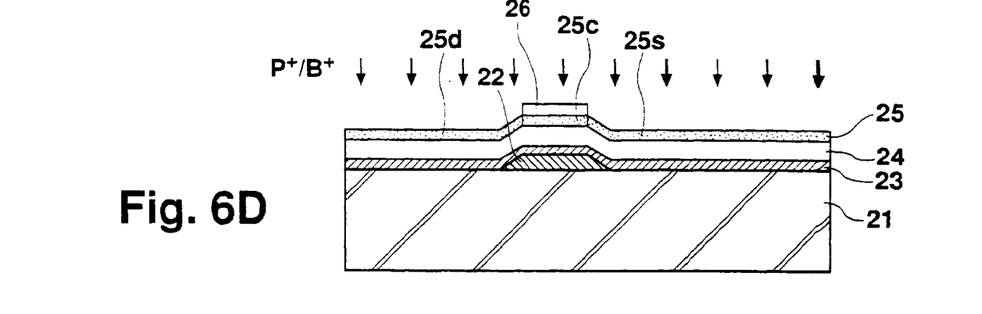

(d) Process 6D

With respect to the polycrystalline silicon film 25, on which is formed the stopper 26, ions for the P type or N type corresponding to the type of transistor to be formed are doped. Namely, when forming a P-channel transistor, P-type ions, such as boron, are doped, and when forming a N-channel transistor, N-type ions, such as phosphorus, are doped. This doping process forms regions exhibiting P-type or N-type conduction in the polycrystalline silicon film 25, except in the region covered by the stopper 26. These regions on both sides of the stopper 26 become the source region 25s and drain region 25d.

Figure 6E:
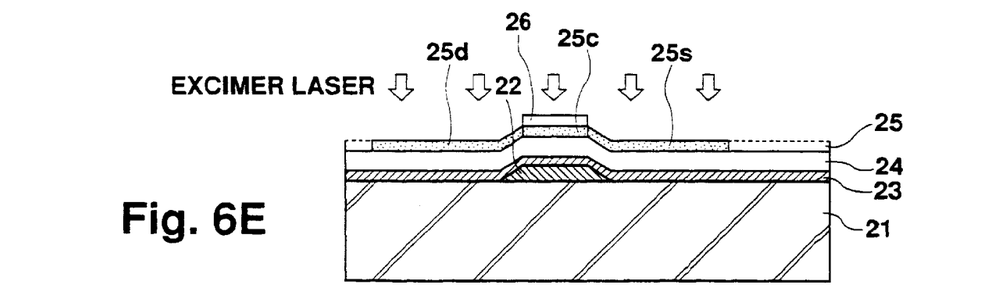

(e) Process 6E

An excimer laser is aimed at the polycrystalline silicon film 25, on which are formed the source region 25s and drain region 25d, and the silicon is heated without being melted. This activates the impurity ions within the source region 25s and drain region 25d. The polycrystalline silicon film 25 is then patterned into an island shape while leaving a predetermined width on both sides of the stopper 26 (gate electrode 22), thus separating the individual transistor.

Figure 6F:
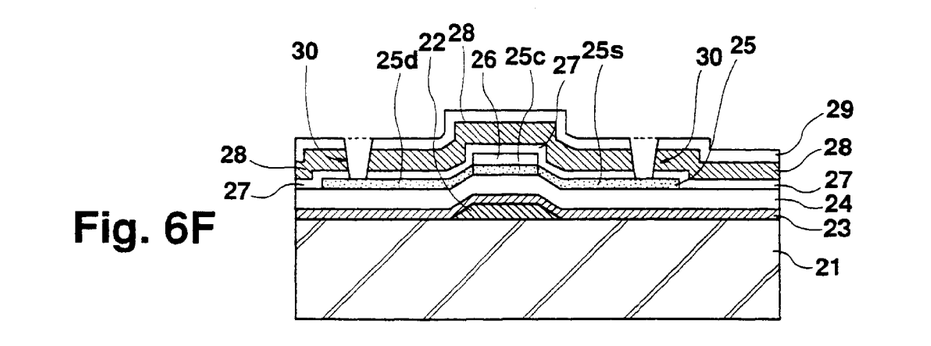

(f) Process 6F

On the polycrystalline silicon film 25 are formed, using plasma CVD, silicon oxide at a film thickness of 1000 angstroms, and in succession silicon nitride at a film thickness of 3000 angstroms, then silicon oxide at a film thickness of 500 angstroms. This forms interlayer insulating film of three films, i.e. silicon oxide film 27, silicon nitride film 28, and silicon oxide film 29.

After being formed, the interlayer insulating film is heated in a nitrogen atmosphere, and the hydrogen ions contained in the silicon nitride film 28 are introduced into the polycrystalline silicon film 25. So as to have sufficient migration of the hydrogen ions and not damage the transparent substrate 21, a temperature range of 350° C. to 450° C. is sufficient for this heat treatment. Since the hydrogen ions included within the silicon nitride film 28 are introduced to the polycrystalline silicon film 25 through the silicon oxide film 27, which is thinly formed in proportion to the film thickness of the silicon nitride film 28, the amount required at the polycrystalline silicon film 25 is reliably supplied. As a result, the crystal defects within the polycrystalline silicon film 25 are filled in by the hydrogen ions.

After the filling in of the crystal defects within the polycrystalline silicon film 25 completes, contact holes 30 passing through the layer insulating films for the source region 25s and drain region 25d are formed, and at the contact holes 30, the source electrode 31s and drain electrode 31d of metal, such as aluminum, are formed. The source electrode 31s and drain electrode 31d are, for example, formed by patterning the aluminum material sputtered on the interlayer insulating film in which the contact holes 30 were formed.

Next, on the interlayer insulating film, on which the source electrode 31s and drain electrode 31d are formed, an acrylic resin solution is applied and baked to form the acrylic resin layer 32. The acrylic resin layer 32 flattens the surface by filling in the unevenness caused by the stopper 26, source electrode 31s, and drain electrode 31d. Furthermore, the contact hole 33 passing through the acrylic resin layer 32 on the source electrode 31s is formed, and at the contact hole 33, the transparent electrode 34 that connects to the source electrode 31s is formed, such as of ITO. The transparent electrode 34 is, for example, formed by patterning the ITO sputtered on the acrylic resin layer 32, on which the contact hole 33 was formed.

The above-mentioned processes 6A to 6F form the bottom-gate type of thin-film transistor having the structure shown in FIG. 3.

FIGS. 7A to 7D are cross-sectional views of individual processes 7A to 7D illustrating the manufacturing method of the thin-film transistor related to in the second embodiment. These views shown the same part as FIG. 5.

Figure 7A:
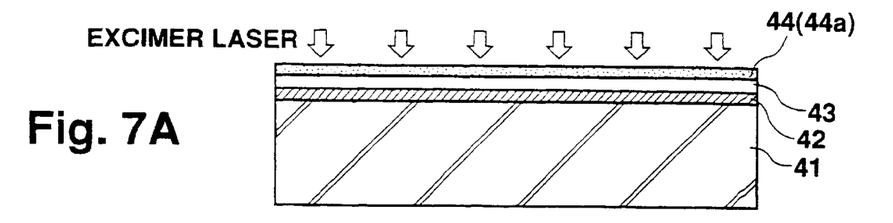
FIG. 7A, 7B, 7C, and 7D are cross-sectional views showing various processes of the manufacturing method related to in the second embodiment.

(a) Process 7A

On the insulating transparent substrate 41 are formed, using plasma CVD, silicon nitride at a film thickness of at least 500 angstroms, and in succession silicon oxide at a film thickness of 500 angstroms. This forms the silicon oxide film 43 to facilitate the disposition of the silicon nitride film 42 for preventing the precipitation of impurity ions from the transparent substrate 41, and polycrystalline silicon film 44 over the silicon nitride. Furthermore, silicon is formed using the same plasma CVD at a film thickness of 400 angstroms to form an amorphous silicon film 44a. After heat treatment of at least one hour at around 430° C. to remove hydrogen from the silicon film 44a until the hydrogen concentration drops to 1 atomic %, the excimer laser is aimed at the silicon film 44a to heat the amorphous silicon until it melts. As a result, the silicon solidifies into the polycrystalline silicon film 44.

Figure 7B:
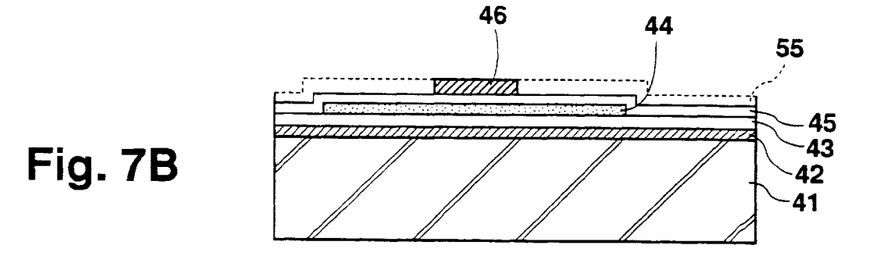

(b) Process 7B

At the position of the transistor to be formed, the polycrystalline silicon film 44 is patterned into a predetermined shape and separated into the individual transistor. After the polycrystalline silicon film 44 is separated, silicon oxide is form using plasma CVD at a film thickness of 1000 angstroms to form the silicon oxide film 45, which becomes the gate insulating film. A metal, such as chromium or molybdenum, is formed using sputtering at a film thickness of 1000 angstroms to form the metal film 54. The metal film 54 is patterned in a predetermined shape so as to cross the polycrystalline silicon film 45 to form the gate electrode 46.

Figure 7C:
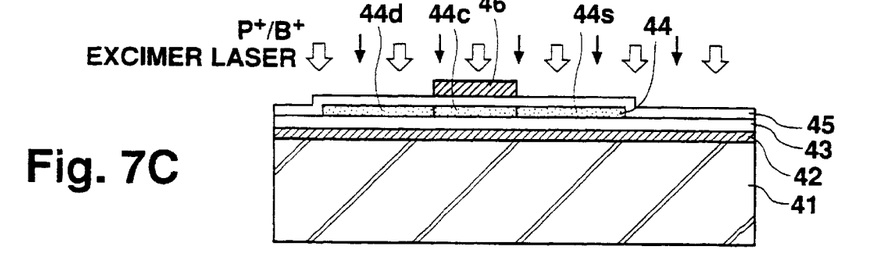

(c) Process 7C

Using the gate electrode 46 as a mask, P-type or N-type ions are doped in the polycrystalline silicon film 44 according to the type of transistor to be formed. This doping process forms regions exhibiting P-type or N-type conduction in the polycrystalline silicon film 44, except in the region covered by the gate electrode 46. These regions become the source region 44s and drain region 44d of the thin-film transistor. An excimer laser is then aimed at the polycrystalline silicon film 44, which has been doped with the predetermined type of conduction impurity ions, so that the silicon is heated without being melted. This activates the impurity ions within the source region 44s and drain region 44d.

Figure 7D:
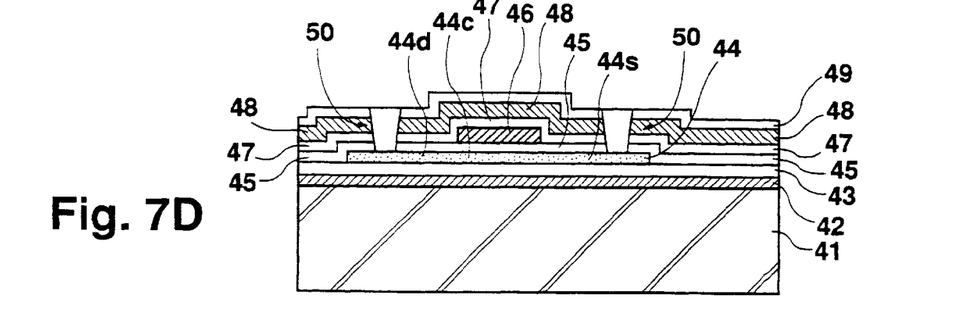

(d) Process 7D

On the silicon oxide film 45, on which the gate electrode 44 was formed, are formed, using plasma CVD, silicon oxide at a film thickness of 1000 angstroms, and in succession silicon nitride at a film thickness of 3000 angstroms, and silicon oxide at a film thickness of 500 angstroms. This forms interlayer insulating film of three layer, i.e. silicon oxide film 47, silicon nitride film 48, and silicon oxide film 49.

After being formed, the interlayer insulating film is heated in nitrogen atmosphere, and the hydrogen ions contained in the silicon nitride film 48 are introduced into the polycrystalline silicon film 44. This heat treatment itself is identical to the heat treatment in process 6F of the bottom-gate type of thin-film transistor manufacturing method shown in FIG. 6F. Since hydrogen ions are easily diffused between the polycrystalline silicon film 44 and the gate electrode 46 with the interface as the diffusion path, hydrogen ions from the side of the gate electrode 46 find their way and penetrate into the portion covered by the gate electrode 46 in the polycrystalline silicon film 44. Therefore, it is not a problem even if the gate electrode 46 formed of the high melting point metal does not allow hydrogen ions to pass. As a result, the crystal defects within the polycrystalline silicon film 44 are filled in by the hydrogen ions.

After the hydrogen ions are introduced within the polycrystalline silicon film 44, the contact holes 50 that pass through the silicon oxide film 45 and interlayer insulating films are formed to correspond to the source region 44s and drain region 44d. The source electrode 51s and drain electrode 51d are then formed of a metal, such as aluminum, at the contact holes 50 as shown in FIG. 5. Next, on the interlayer insulating films, on which the source electrode 51s and drain electrode 51d are formed, an acrylic resin solution is applied and baked to form the acrylic resin layer 52. The acrylic resin layer 52 flattens the surface by filling in the unevenness caused by the gate electrode 46, source electrode 51s, and drain electrode 51d. Furthermore, the contact hole 53 passing through the acrylic resin layer 52 above the source electrode 51s is formed, and at the contact hole 53, the transparent electrode 54 that connects to the source electrode 51s is formed, such as of ITO.

The above-mentioned processes 7A to 7D form the top-gate type of thin-film transistor having the structure shown in FIG. 5.

The various film thickness dimensions exemplified in the aforementioned embodiments are optimum values under specific conditions and are not absolute values that must be observed. Furthermore, the uppermost layer of the layer insulating film need not necessarily be the silicon oxide film, and may be another material film having a sufficiently large etching rate compared to the silicon nitride film in the middle layer that serves as the source of hydrogen ions.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A manufacturing method for a thin-film transistor comprising:

a first process for forming a gate electrode on one principal plane of a substrate;

a second process for forming a gate insulating film so as to cover said gate electrode on said substrate, and forming a semiconductor film on said gate insulating film;

a third process for forming in sequence a first silicon oxide film, a silicon nitride film and a second silicon oxide film on said semiconductor film to form a layer insulating film;

a fourth process for forming a contact hole through said layer insulating film so as to reach said semiconductor film; and a fifth process for forming an electrode to be connected to said semiconductor film through said contact hole;

said fourth process successively etching said first silicon oxide film, said silicon nitride film and said second silicon oxide film in an isotropic manner.

2. The manufacturing method for the thin-film transistor according to claim 1 further comprising:

a process, after said third process, for heating both said layer insulating film and said semiconductor film to introduce hydrogen ions contained in said layer insulating film within said semiconductor film.

3. The manufacturing method for a thin-film transistor according to claim 1, wherein said fourth process successively etches said first silicon oxide film, said silicon nitride film and said second silicon oxide film using a same etching method.

4. A manufacturing method for a thin-film transistor comprising:

a first process for forming a semi-conductor film on one principal plane of a substrate;

a second process for forming a gate insulating film on said semiconductor film and forming a gate electrode on said gate insulating film;

a third process for forming in sequence a first silicon oxide film, a silicon nitride film and a second silicon oxide film on said gate insulating film to form a layer insulating film so as to cover said gate electrode;

a fourth process for forming a contact hole through said gate insulating film and said layer insulating film so as to reach said semiconductor film; and a fifth process for forming an electrode to be connected to said semiconductor film through said contact hole;

said fourth process successively etching said first silicon oxide film, said silicon nitride film and said second silicon oxide film in an isotropic manner.

5. The manufacturing method for the thin-film transistor according to claim 4 further comprising:

a process, after said third process, for heating both said layer insulating film and said semiconductor film to introduce hydrogen ions contained in said layer insulating film within said semiconductor film.

6. The manufacturing method for a thin-film transistor according to claim 4, wherein said fourth process successively etches said first silicon film, said silicon nitride film and said second silicon oxide film using a same etching method.

7. A manufacturing method for a thin-film transistor comprising:

a first process for forming a gate electrode on one principal plane of a substrate;

a second process for forming a gate insulating film so as to cover said gate electrode on said substrate, and forming a semiconductor film on said gate insulating film;

a third process for forming in sequence a first silicon oxide film on said semiconductor film for matching with said semiconductor film, a silicon nitride film acting as a hydrogen ion supply for said semiconductor film, and a second silicon oxide film having a faster etching rate than said silicon nitride film for etching during the formation of said contact hole, as a layer insulating film;

a fourth process for forming a contact hole through said layer insulating film so as to reach said semiconductor film; and a fifth process for forming an electrode to be connected to said semiconductor film through said contact hole;

said fourth process successively etching said first silicon oxide film, said silicon nitride film and said second silicon oxide film in an isotropic manner.

* * * * *

UNITED STATES PATENT AND TRADEMARK OFFICE
CERTIFICATE OF CORRECTION

PATENT NO. : 6,265,247 B1
DATED : July 24, 2001
INVENTOR(S) : Shiro Nakanishi et al.

It is certified that error appears in the above-identified patent and that said Letters Patent is hereby corrected as shown below:

Title page,
Item [75], Inventors, after "Nakanishi," delete "Ohgaki; Nobuhiko Oda, Hashima both of (JP)" and insert therefor -- Nobuhiko Oda, both of Gifu (JP) --

Column 10,
Line 34, after "silicon" (first occurance) insert -- oxide --

Signed and Sealed this

Twenty-second Day of March, 2005

JON W. DUDAS
*Director of the United States Patent and Trademark Office*